(12) United States Patent
Takizawa

(10) Patent No.: US 6,653,177 B2
(45) Date of Patent: Nov. 25, 2003

(54) PATTERNING METHOD, THIN FILM TRANSISTOR MATRIX SUBSTRATE MANUFACTURING METHOD, AND EXPOSURE MASK

(75) Inventor: Hideaki Takizawa, Kawasaki (JP)

(73) Assignee: Fujitsu Display Technologies Corporation, Kawasaki (JP)

( * ) Notice: Subject to any disclaimer, the term of this patent is extended or adjusted under 35 U.S.C. 154(b) by 45 days.

(21) Appl. No.: 09/961,871

(22) Filed: Sep. 24, 2001

(65) Prior Publication Data
US 2002/0039841 A1 Apr. 4, 2002

(30) Foreign Application Priority Data
Sep. 27, 2000 (JP) ........................................ 2000-295275

(51) Int. Cl.[7] .............................................. H01L 21/00
(52) U.S. Cl. ...................... 438/158; 438/159; 438/160; 438/200; 257/59; 257/61; 257/66; 257/72
(58) Field of Search ................................. 438/384, 158, 438/159, 160, 200; 257/59, 61, 66, 72; 716/19, 21

(56) References Cited

U.S. PATENT DOCUMENTS 5,795,686 A * 8/1998 Takizawa et al. .............. 430/5

FOREIGN PATENT DOCUMENTS

JP 09-236930 9/1997

* cited by examiner

Primary Examiner—Matthew Smith
Assistant Examiner—Victor V Yevsikov
(74) Attorney, Agent, or Firm—Greer, Burns & Crain, Ltd.

(57) ABSTRACT

There is provided a patterning method which makes it possible to form a desired preferable pattern having no reduction in the pattern thickness in a boundary portion where a group of patterns are joined using a plurality of exposure masks. There is provided a patterning method for forming a group of patterns in which first patterns to serve as basic units are repetitively arranged using a plurality of exposure masks. When a third region sandwiched by a first region exposed with a first exposure mask and a second region exposed with a second exposure mask is exposed with the first and second exposure masks in a complementary manner, repetitive unit patterns for exposing the third region are different from the first patterns.

5 Claims, 12 Drawing Sheets

PATTERNING METHOD, THIN FILM TRANSISTOR MATRIX SUBSTRATE MANUFACTURING METHOD, AND EXPOSURE MASK

BACKGROUND OF THE INVENTION

1. Field of the Invention

The present invention relates to a patterning method and a method of manufacturing a TFT (thin film transistor) matrix substrate and, more particularly, to a patterning method for connecting patterns to form a single pattern as a whole and a method of manufacturing a thin film transistor substrate utilizing the patterning method.

2. Description of the Related Art

TFT matrix type color liquid crystal displays have been spreading recently as displays of personal computers and wall-mount televisions. This has resulted in a trend toward liquid crystal displays with greater screens.

In order to manufacture such displays at low cost, it is important to form TFT matrices with less processing steps and higher yield, which is primarily achieved by photolithographic techniques utilizing reticles (exposure mask) capable of transferring a multiplicity of patterns simultaneously. Normally, one reticle (called one layer) is used for one patterning step.

In the case of a large screen which has a great substrate, it is difficult to transfer the entire pattern of one layer at a time for reasons associated with the structure of the exposure device. For this reason, the entire patterned region of one layer is divided into a plurality of sub-regions, and a plurality of reticles are provided to process each of the sub-regions. When the entire pattern is formed, each of the sub-regions of the same resist film is separately exposed by masking regions other than the sub-region to be exposed to form the entire pattern.

FIG. 4 schematically shows a TFT matrix substrate 50. The number of pixels in FIG. 4 is shown in a simplified manner. Basic pixel units 40 driven by TFTs 36 are arranged in the form of a matrix of 6 rows×9 columns. The configuration will now be briefly described. Gate bus lines 32 and drain bus lines 34 are arranged on a glass substrate 30 perpendicularly to each other, and TFTs 36 (the configuration of which will be described later) are provided near intersections between the gate bus lines 32 and drain bus lines 34. The gates of the TFTs 36 are connected to the gate bus lines 32, and the drains are connected to the drain bus lines 34. Further, source electrodes of the TFTs 36 are connected to pixel electrodes 38. A unit region formed by a TFT 36, pixel electrode 38, gate bus line 32 and drain bus line 34 connected each other is referred to as "basic" pixel unit', and a pattern in such a region is referred to as "basic unit pattern".

When the TFT matrix as shown in FIG. 4 is formed using two reticles, a method may be used in which the matrix is simply divided into two regions, i.e., the region of the first through fourth columns (left region) and the region of the fifth through ninth columns (right region) along a linear border line. As will be apparent from the plan view in FIG. 5 and the sectional view in FIG. 6 (sectional view taken along the line A—A in FIG. 5), a TFT 36 is formed such that a gate electrode 32 (a gate bus line 32) overlaps a source electrode 36S and a drain electrode 36D in consideration to alignment accuracy and, as a result, a floating capacity Cgs is generated between the gate electrode 32 and source electrode 36S. When the left and right regions described above are separately aligned to solve this, a difference may occur in the width of an overlap of the source electrode 36S and gate electrode 32 between the TFTs 36 in the left region and the TFTs 36 in the right region. In this case, since the TFTs 36 in the left and right regions have different floating capacities Cgs, those regions will have different source electrode, which causes a difference in transmittance between them. As a result, a difference in luminance occurs between the two regions to cause unevenness of display. While the above example is divided in the lateral direction, division in the longitudinal direction may be adopted in addition to lateral division in practice because of a greater number of pixels, in which case misalignment can occur in all directions.

As a method of solving such unevenness of display, patterning methods are disclosed in Japanese Patent Laid-Open No. 236930/1997 and so on in which unit patterns of different exposure masks are mixed at a joint between groups of unit patterns formed by different exposure masks.

FIG. 7 is a schematic illustration of the conventional technique disclosed in the above-cited publication in which two (a pair of) reticles are shown. Reticles RTa3 and RTb3 are provided to form a TFT matrix of 6 rows×6 columns. Although there is exposure steps for a plurality of layers and different exposure patterns exist for respective layers in practice, for simplicity of description, simplified patterns of gate bus lines 66, drain bus lines, TFTs 70 and pixel electrodes are shown here to clearly indicate basic pixel units 72.

The TFT matrix having 6 columns is divided in two columns to define a first region (the first and second columns), a second region (the fifth and sixth columns) and a third region (the third and fourth columns), and the third region is a boundary portion to serve as a joint during pattern formation using the two reticles. Therefore, in the reticle RTa3, patterning regions 78 for exposing the basic pixel units 72 are provided in a region 100 corresponding to the first region, and patterning regions 78 and shading regions 76 which are non-patterning regions where no exposure occurs are provided in a staggered configuration in a region 300a' corresponding to the third region. In the reticle RTb3, patterning regions 78 for exposing the basic pixel units 72 are provided in a region 200 corresponding to the second region, and patterning regions 78 and shading regions 76 which are non-patterning regions where no exposure occurs are provided in a staggered configuration that is the reverse of (complement to) that in the reticle RTa3 in the region 300a' corresponding to the third region. Therefore, the basic pixel units 72 in the third region are exposed and patterned when one of the reticles RTa3 and RTb3 is used and are not exposed when the other reticle is used because of the shading regions.

When such a boundary portion is provided to mix unit patterns associated with different exposure masks in the boundary portion, it is difficult to recognize a clear boundary even if any difference in luminance exits between the patterns formed using the different masks.

FIGS. 8 and 9 show parts of reticles used in a specific application of the patterning method shown in FIG. 7. Reticles RTa4 and RTb4 are provided to form a TFT matrix pattern having nine columns as shown in FIG. 4 in which the first and second columns are a first region; the eighth and ninth columns are a second region; and the third through seventh columns are a third region.

The reticle RTa4 shown in FIG. 8 is provided to pattern the first and third regions, and patterning regions 78 associated with basic pixel units 72 are provided in a portion corresponding to the first region (the first and second columns). In a portion corresponding to the third region (the third through seventh columns), there is provided patterning regions 78 associated with the regions of basic pixel units 72 and shading regions 76 similarly associated with the regions of basic pixel units 72 in a staggered configuration.

The reticle RTb4 shown in FIG. 9 is provided to pattern the second and third regions, and patterning regions 78 associated with basic pixel units 72 are provided in a portion corresponding to the third region (the eighth and ninth columns). In a portion corresponding to the second region (the third through seventh columns), there is provided patterning regions 78 associated with the regions of basic pixel units 72 and shading regions 76 similarly associated with the regions of basic pixel units 72 in a staggered configuration which is complementary to that of the reticle RTa4.

Specifically, the reticles RTa4 and RTb4 are used for patterning drain electrodes, source electrodes, drain bus lines and storage capacitor electrodes for a storage capacitor at steps for manufacturing a TFT matrix. That is, storage capacitor electrodes 42, source electrodes 36S, drain electrodes 36D and drain bus lines 34 in FIGS. 8 and 9 are patterned at the same step, although the process will be detailed later. In a basic pixel unit 72 (patterning region 78), a shading pattern associated with a storage capacitor electrode 42, source electrode 36S, drain electrode 36D and drain bus line 34 is formed.

FIG. 10A is an enlarged view of the circled portion in FIG. 8, and FIG. 10B is a sectional view taken along the line X—X in FIG. 10A.

Referring to FIG. 1A, in a portion where a shading region 76 is provided on the left side and adjacent to a patterning region 78, a shading pattern for the patterning region 78 associated with a desired drain bus line pattern extends along and close to an edge of the shading pattern of the shading region 76 on the right side of the same. Further, a desired shading pattern associated with a storage capacitor electrode pattern having a desired storage capacitor is formed on the right side of the same. Referring to FIG. 10B, the reticle RTa4 is a transparent substrate 80 made of glass or the like formed with a shading pattern 82 constituted by a metal film having a light-blocking property such as chromium.

Next, referring to FIG. 11A and FIG. 11B, in a portion where a shading region 76 is provided on the right side and adjacent to a patterning region 78, a desired shading pattern corresponding to a storage capacitor electrode pattern of the patterning region 78 on the left side of the shading pattern of the shading region 76. Further, similar to the reticle Rta4, in a reticle RTb4, a shading pattern 82 is constituted by a metal film having a light-blocking property such as chromium on a transparent substrate 80 made of glass or the like.

FIG. 12 illustrates the shading pattern of the reticle RTb4 shown in FIG. 11A overlapped with the shading pattern of the patterning region of the reticle RTa4 in FIG. 10A. An interval L between an edge of the shading pattern of the reticle RTa4 associated with a data bus line and an edge of the shading pattern of the shading region of the reticle RTb4 depends on the desired pattern or a pattern interval G between the storage capacitor electrode and data bus line. Therefore, the interval L becomes small as the interval G becomes small as a result of an increase in the fineness of the patterns. The interval L can become small also due to a misalignment of the reticles.

When the interval L becomes small, light can enter to expose a region which should not be exposed as a result of diffraction from the edge of the shading pattern of the shading region 76 during exposure of one of the reticles (the reticle RTb4, for example). Therefore, for example, in the case of a data bus line, a narrow pattern smaller than a desired pattern width can be formed.

SUMMARY OF THE INVENTION

The present invention was made taking the above-described problems in the related art into consideration, and it is an object of the invention to provide a patterning method which makes it possible to form a desired preferable pattern without any reduction of the pattern at a boundary where a group of patterns formed using a plurality of exposure masks are joined and to provide a method of forming a TFT matrix substrate.

In a first aspect of the invention, the above-described problems are solved by a patterning method that is characterized as follows.

There is provided a patterning method for forming a group of patterns in which first patterns serving as basic units are repetitively arranged using a plurality of exposure masks, in which a third region sandwiched between a first region exposed with a first mask and a second region exposed with a second mask is exposed in a complementary manner with the first and second exposure masks, repetitive unit patterns for exposing the third region being different from the first patterns.

In the first aspect of the invention, patterning regions and shading regions are provided in the third region when it is exposed. A desired pattern of a patterning region is not affected by the shading region when exposure is performed the other mask, which makes it possible to achieve the desired pattern because no reduction of the pattern occurs due to unnecessary exposure.

In a second aspect of the invention, the above-described problems are solved by a method of manufacturing a thin film transistor matrix substrate that is characterized as follows.

There is provided a method of manufacturing a thin film transistor matrix substrate having the step of forming at least either gate bus lines or drain bus lines using the patterning method in the first aspect of the invention.

In the second aspect of the invention, a gate bus line, drain bus line or the like is provided at an edge of a basic pixel unit within the region of the same. Therefore, if the patterning regions repetitively provided in the third region are provided with in the pattern of the basic pixel unit, the patterns of the gate bus line and drain bus line can be adversely affected when exposed with a plurality of exposure masks. However, the use of a pattern that is different from the basic pixel unit makes it possible to achieve a desired pattern without any influence.

DETAILED DESCRIPTION OF PREFERRED EMBODIMENT

An embodiment of the invention will now be described with reference to the drawings.

Figure 1:
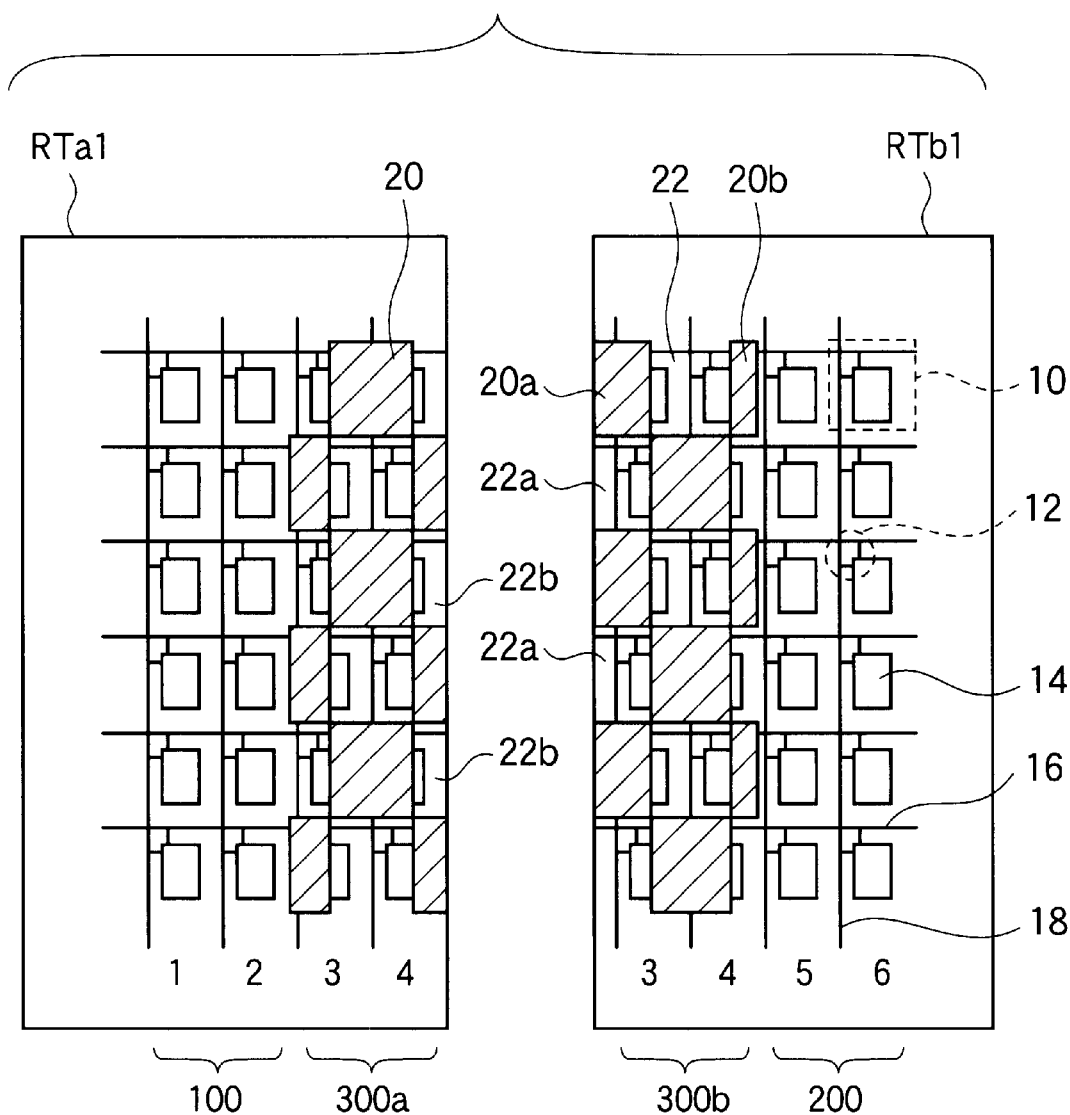
FIG. 1 illustrates a principle of the invention.

FIG. 1 illustrates a principle of the invention and shows a pair of reticles (exposure masks) RTa1 and RTb1.

The reticles RTa1 and RTb1 are provided to form a TFT matrix of 6 rows×6 columns. Although there is exposure steps for a plurality of layers and different exposure patterns exist for respective layers in practice, for simplicity of description, simplified patterns of gate bus lines 16, drain bus lines 18, TFTs 12 and pixel electrodes 14 are shown here to clearly indicate basic pixel units 10.

The TFT matrix having 6 columns is divided in two columns to define a first region (the first and second columns), a second region (the fifth and sixth columns) and a third region (the third and fourth columns), and the third region is a boundary portion to serve as a joint during pattern formation using the two reticles. Therefore, in the reticle RTa1, patterning regions for exposing the basic pixel units 10 (also called basic unit patterns 10) which are first patterns to serve as basic units are provided in a region 100 corresponding to the first region. In a region 300a corresponding to the third region, there is provided three types of patterning regions 22, 22a and 22b and three types of shading regions 20, 20a and 20b that are non-patterning regions where no exposure occurs. The patterning regions and shading regions of the invention are different from the basic unit patterns 10 in the prior art. Specifically, a patterning region 22 is a combination of a pattern that is a right half of one basic unit pattern 10 and a pattern that is a left half of another basic unit pattern adjacent to the first basic unit pattern. A patterning region 22a is a pattern of only a right half of a basic unit pattern 10, and a patterning region 22b is a pattern of only a left half of a basic unit pattern 10. In the present embodiment, the patterning region 22a has the same pattern as the right half of the patterning region 22, and the patterning region 22b has the same pattern as the left half of the patterning region 22. However, the ratios of the patterning regions 22a and 22b to the patterning region 22 do not need to be 0.5:0.5. An arbitrary ratio can be used for the patterning regions 22a and 22b. For example, the ratio of the patterning regions 22a and 22b can be set to 0.8:0.2, or can be set to 1.0:0. The shading regions 20, 20a and 20b shade regions associated with the patterning regions 22, 22a and 22b, respectively.

In a region 200 of the reticle RTb1 corresponding to the second region, there is provided patterning regions for exposing the patterns of the basic pixel units 10 (also called basic unit patterns 10) which are first patterns serving as basic units. In a region 300a corresponding to the third region, there is provided three types of patterning regions 22, 22a and 22b and three types of shading regions 20, 20a and 20b that are non-patterning regions where no exposure occurs, just as in the reticle RTa1.

The shading regions 20, 20a and 20b and the patterning regions 22, 22a and 22b formed in each of the reticles RTa1 and RTb1 are provided in complementary positions, and they are provided in a staggered configuration in each of the reticles in the example in FIG. 1.

Figure 2:
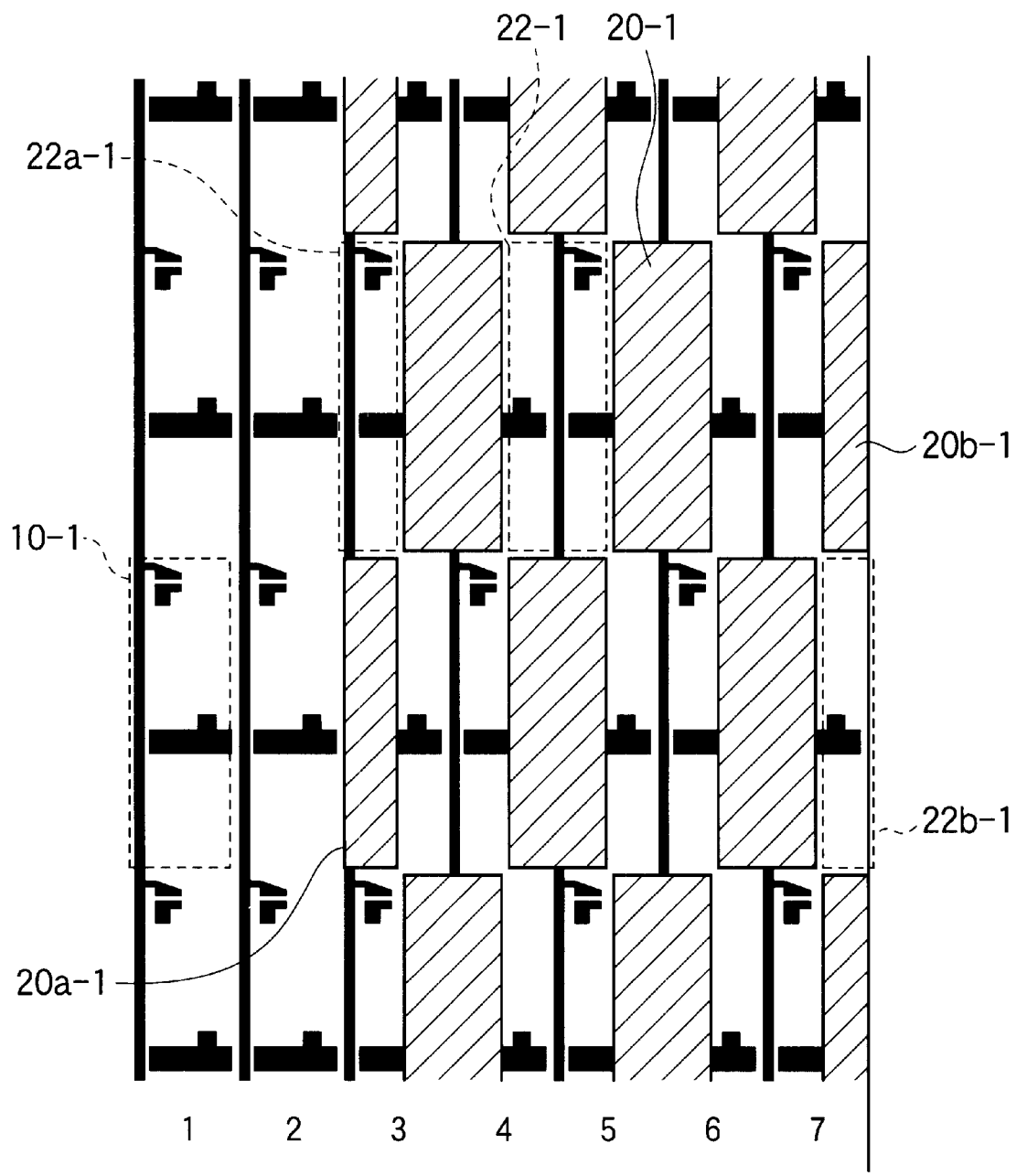
FIG. 2 illustrates a first reticle in an embodiment of the invention.
Figure 3:
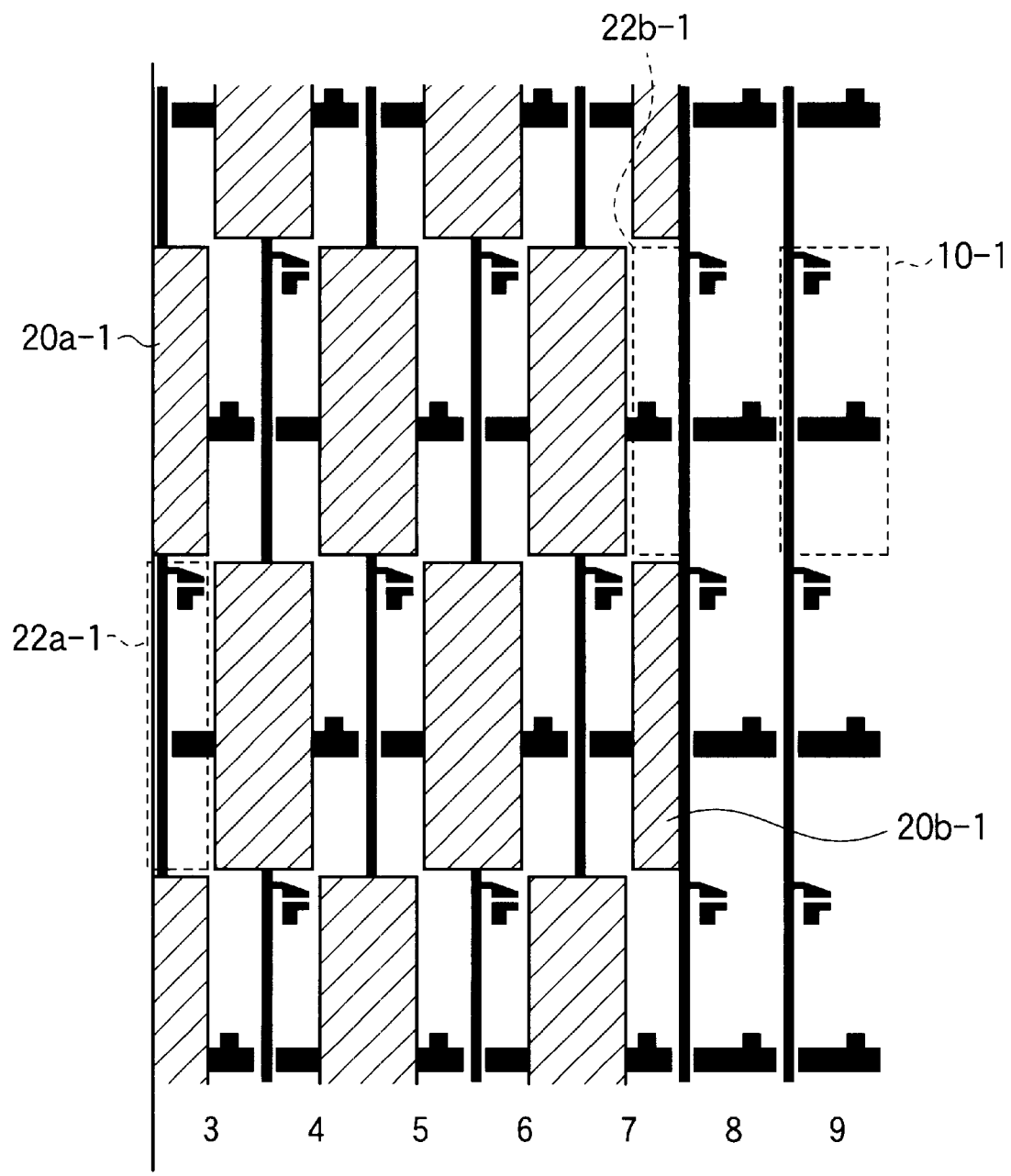
FIG. 3 illustrates a second reticle in the embodiment of the invention.
Figure 4:
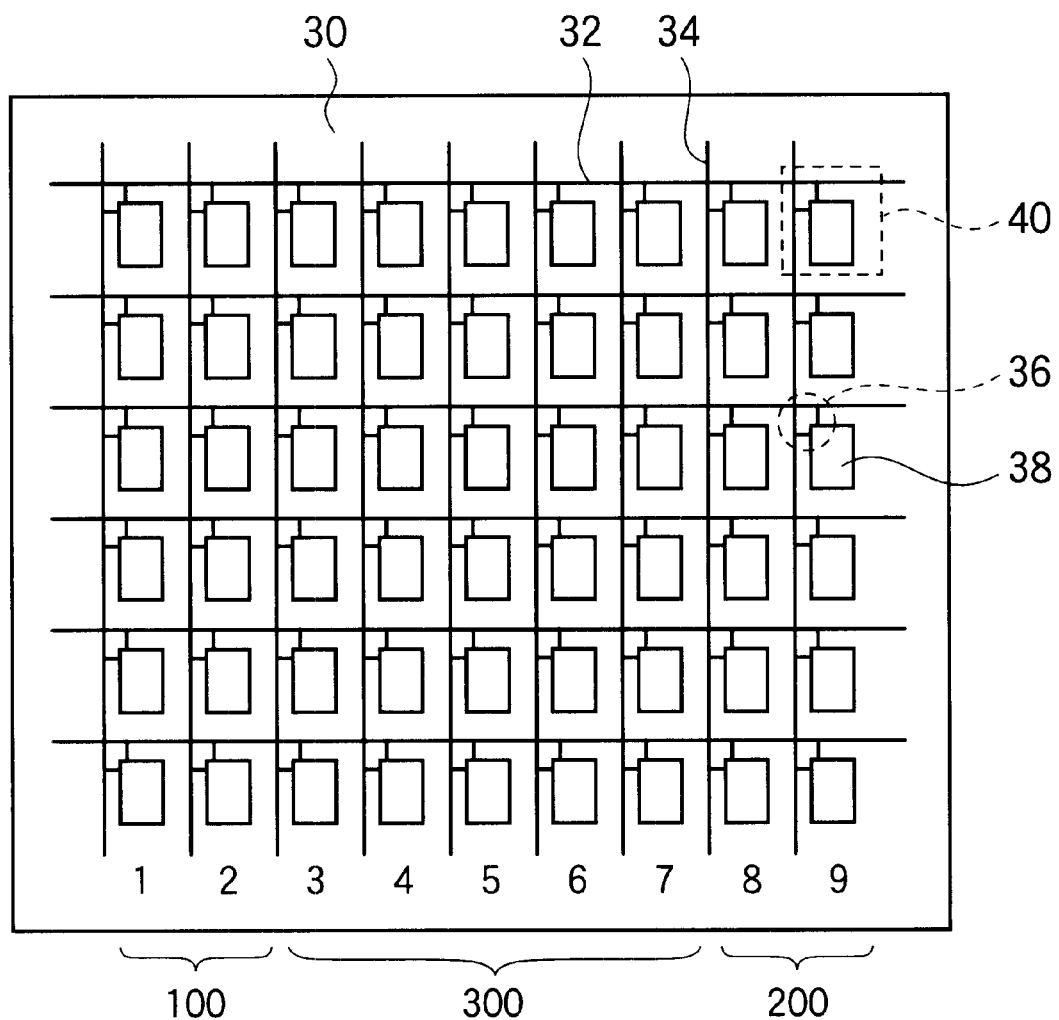
FIG. 4 illustrates a TFT matrix substrate.

FIGS. 2 and 3 show parts of a pair of reticles (exposure masks) used in a method of manufacturing a TFT matrix substrate that is an embodiment of the invention. They are used for forming a pattern of a TFT matrix substrate in which nine columns of pixels are arranged as shown in FIG. 4. Referring to FIG. 4, the first and second columns are a first region 100; the eighth and ninth columns are a second region 200; and the third through seventh columns are a third region 300 which is a boundary portion.

Reticles RTa2 and RTb2 in FIG. 2 and 3 are used for patterning source and drain electrodes, drain bus lines and storage capacitor electrodes for a storage capacitor of TFTs at manufacturing steps to be described later.

The reticle RTa2 shown in FIG. 2 is provided for patterning the first region 100 and third region 300. Patterning regions 10-1 corresponding to the basic unit patterns 10 are provided in a portion corresponding to the first region (the first and second columns). In a patterning region 10-1, patterns associated with the source and drain electrode, drain bus line and a storage capacitor electrode for a storage capacitor of a TFT are provided, and the pattern associated with the drain bus line is provided in the region at an edge thereof.

In a portion corresponding to the third region (the third through seventh columns), there is provided three types of patterning regions 22-1, 22a-1 and 22b-1 and three types of shading regions 20-1, 20a-1 and 20b-1 that are non-patterning regions where no exposure occurs.

In a patterning region 22-1, a pattern is provided which is a combination of halves of the patterns of two adjacent patterning regions 10-1, and the pattern associated with the drain bus line is provided in the middle of the region apart from an edge of the shading pattern. In a patterning region 22a-1, a pattern of a right half of a patterning region 10-1, i.e., a pattern that is apart of the source and drain electrodes, drain bus line and storage capacitor electrode is provided. In a patterning region 22b-1, a pattern of a left half of a patterning region 10-1, i.e., a pattern that is a part of the storage capacitor electrode is provided.

The shading regions 20-1, 20a-1 and 20b-1 shade regions associated with the patterning regions 22-1, 22a-1 and 22b-1, respectively, and the patterning regions 22-1, 22a-1 and 22b-1 and the shading regions 20-1, 20a-1 and 20b-1 are provided in a staggered configuration.

The reticle RTa2 shown in FIG. 3 is provided for patterning the second region 200 and third region 300, and patterning regions 10-1 corresponding to the basic unit patterns 10 are provided in a portion corresponding to the second region (the eighth and ninth columns). In the patterning regions 10-1, patterns similar to the patterning regions 10-1 of the reticle RTa2 in FIG. 2 are provided.

In a portion corresponding to the third region (the third through seventh columns), there is provided three types of patterning regions 22-1, 22a-1 and 22b-1 and three types of shading regions 20-1, 20a-1 and 20b-1 that are non-patterning regions where no exposure occurs. Those are patterns similar to the patterns in the reticle RTa2 in FIG. 2.

The shading regions 20-1, 20a-1 and 20b-1 and patterning regions 22-1, 22a-1 and 22b-1 formed in each of the reticles RTa2 and RTb2 are provided in complementary positions, and they are provided in a staggered configuration in each of the reticles in the example in FIGS. 2 and 3.

Figure 12:
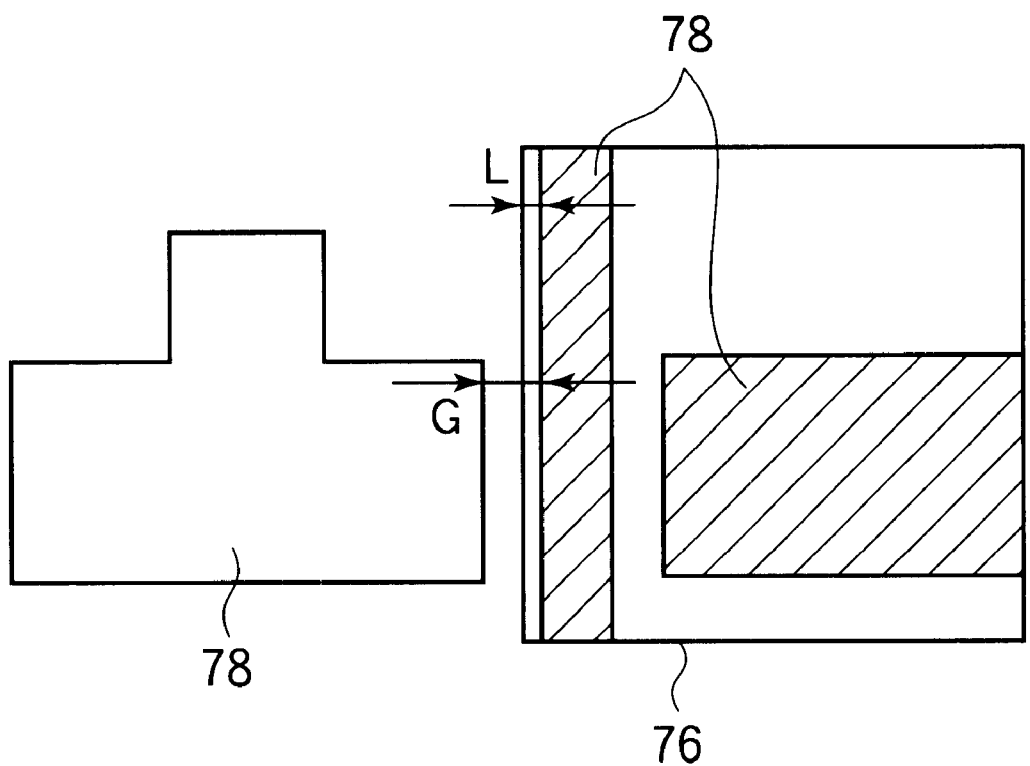
FIG. 12 illustrates problems with the prior art.

In the above-described example, since divisions of basic unit patterns are combined, a pattern that is vulnerable to diffracted light from a shading pattern of the other reticle, e.g., a pattern such as a drain bus line pattern that is thin and that is normally provided in the vicinity of an edge of a basic unit pattern can be provided in the vicinity of the center of a patterning region. This makes it possible to increase the interval L in FIG. 12, which eliminates influence of light diffracted from an edge of a shading pattern. As a result, a desired pattern having a preferable shape can be obtained.

Further, since a pattern that is originally an integral and continuous pattern is divided in the above embodiment, each of the divided patterns becomes a shading pattern that is connected to a shading pattern in a shading region. This provides an increased margin for reticle alignment accuracy and the configuration of shading patterns.

A description will now be made on a method of manufacturing a TFT matrix substrate in which reticles RTa2 and RTb2 as shown in FIGS. 2 and 3 are used.

Figure 5:
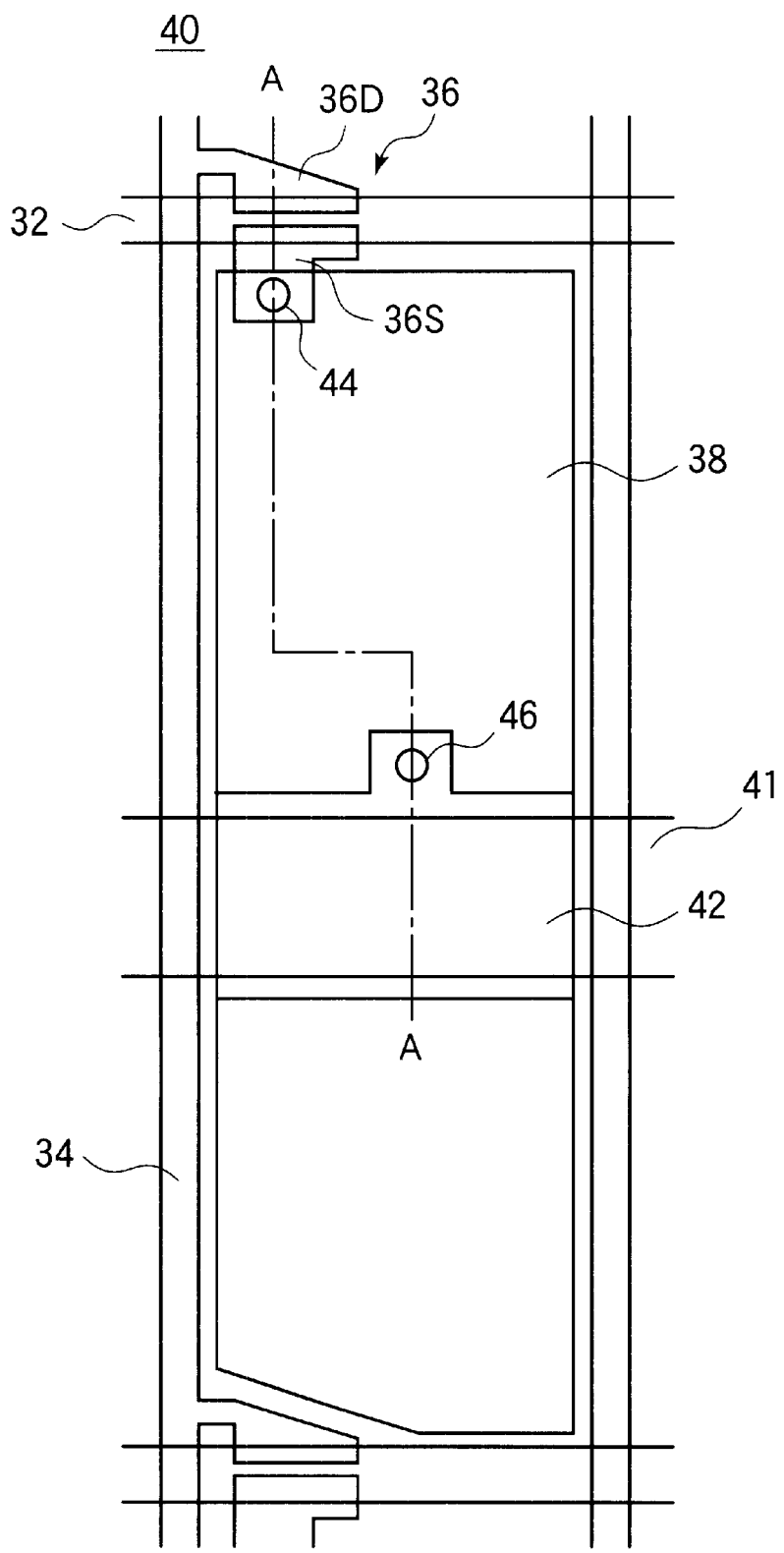
FIG. 5 illustrates a pixel region.
Figure 6:
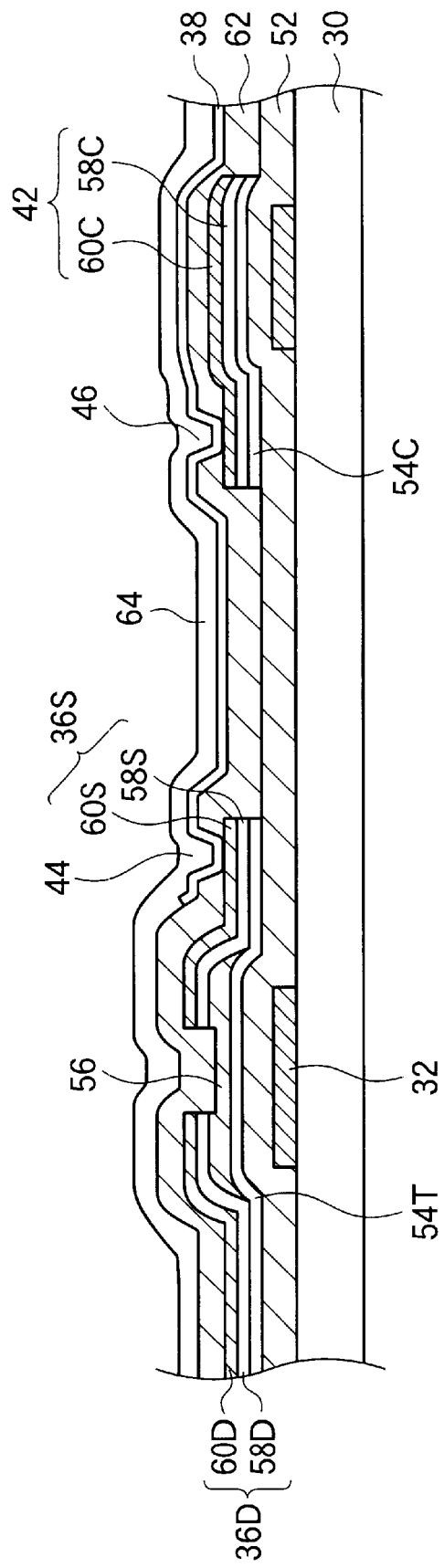
FIG. 6 is a sectional view taken along the line A—A in FIG. 5.
Figure 7:
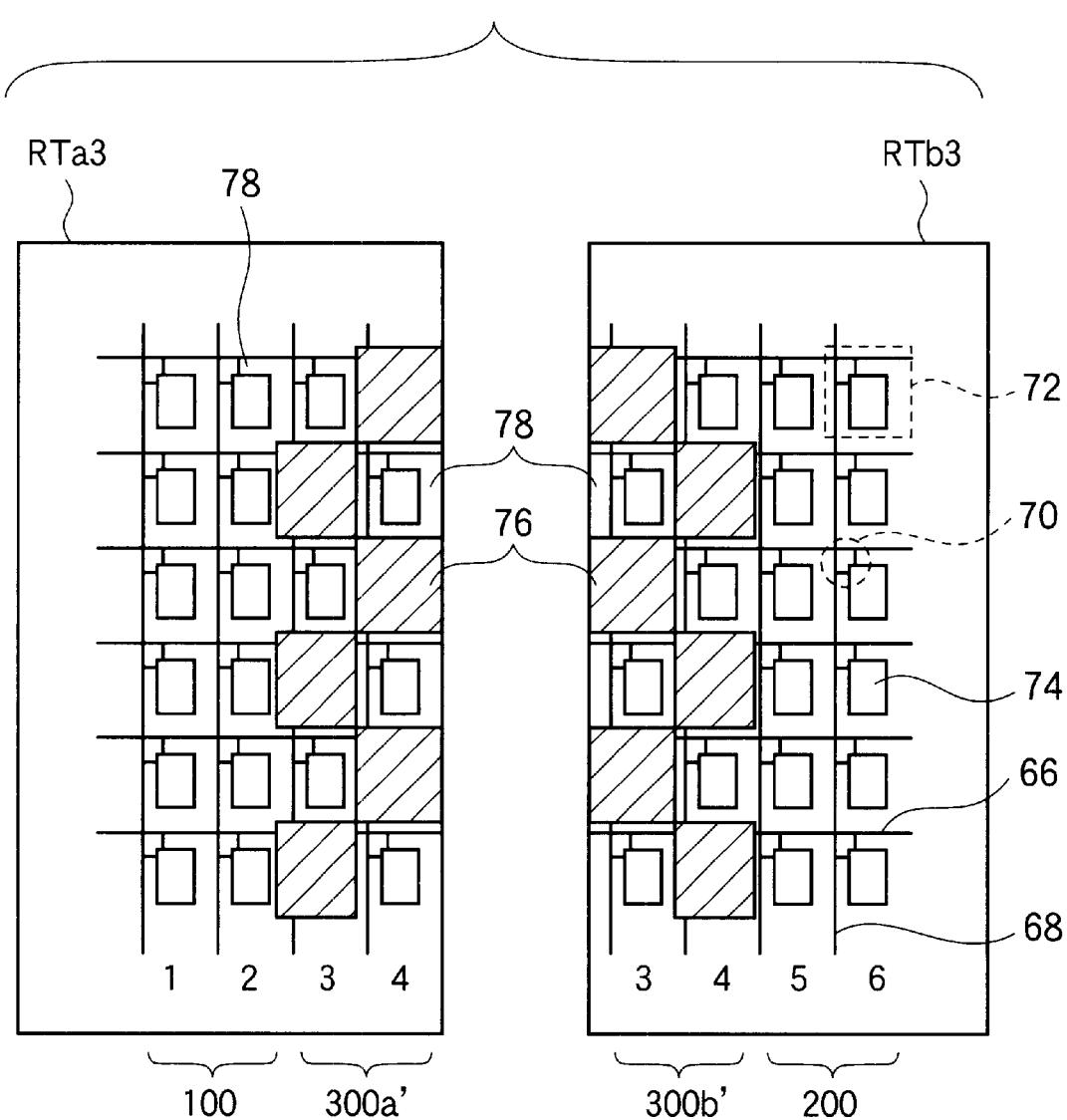
FIG. 7 illustrates an example of the prior art.
Figure 8:
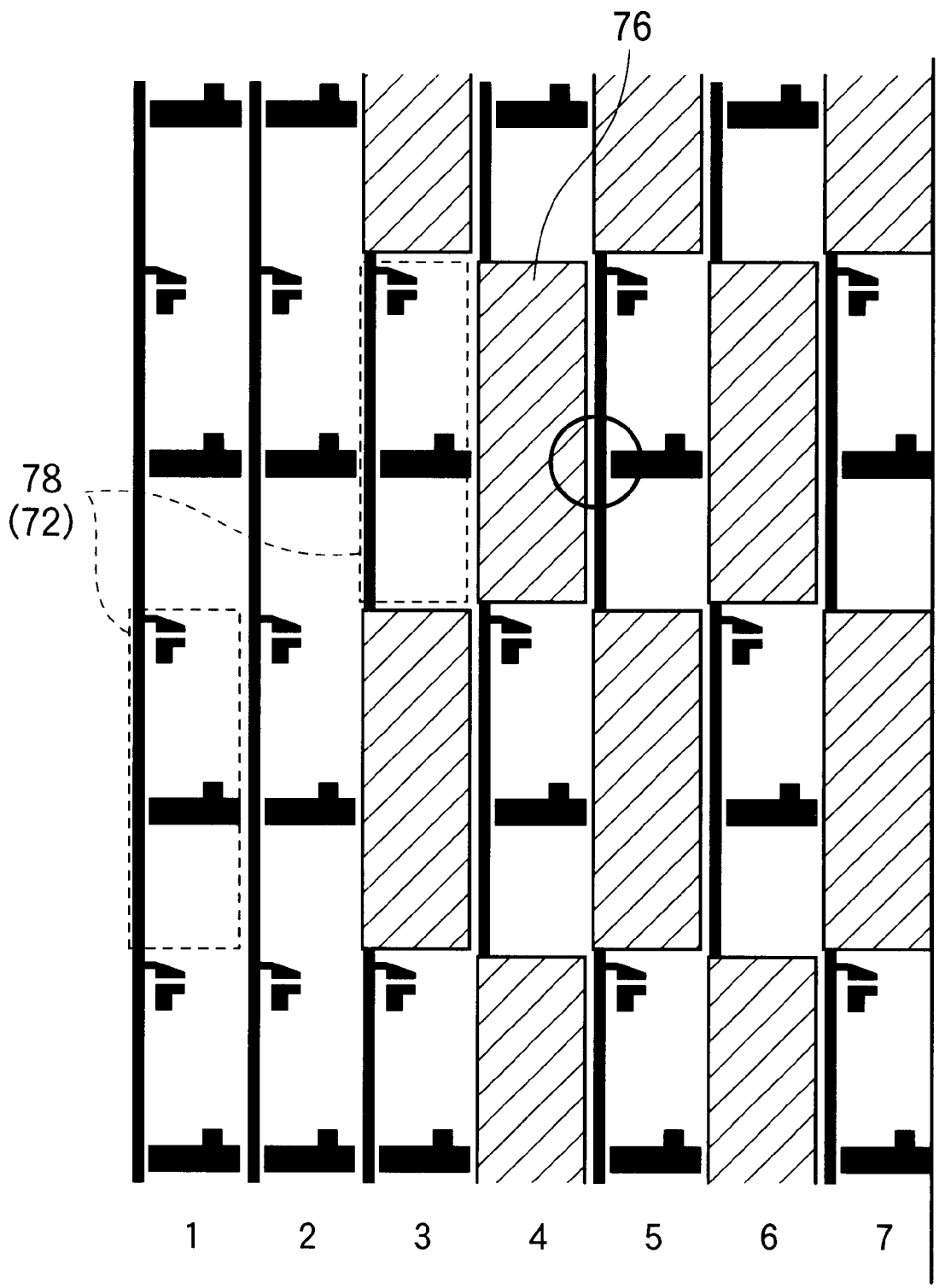
FIG. 8 illustrates a first reticle in the example of the prior art.
Figure 9:
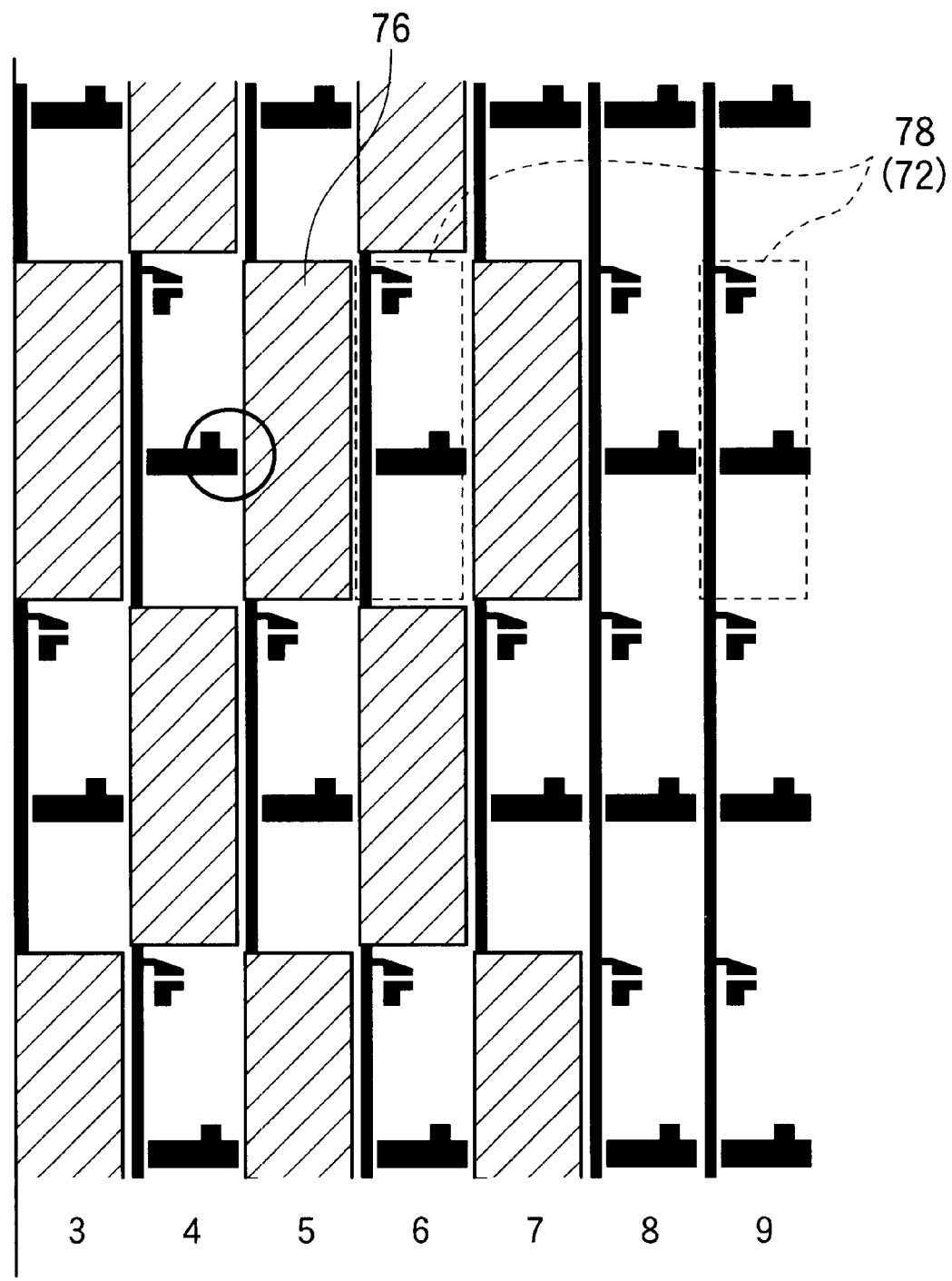
FIG. 9 illustrates a second reticle in the example of the prior art.
Figure 10A:
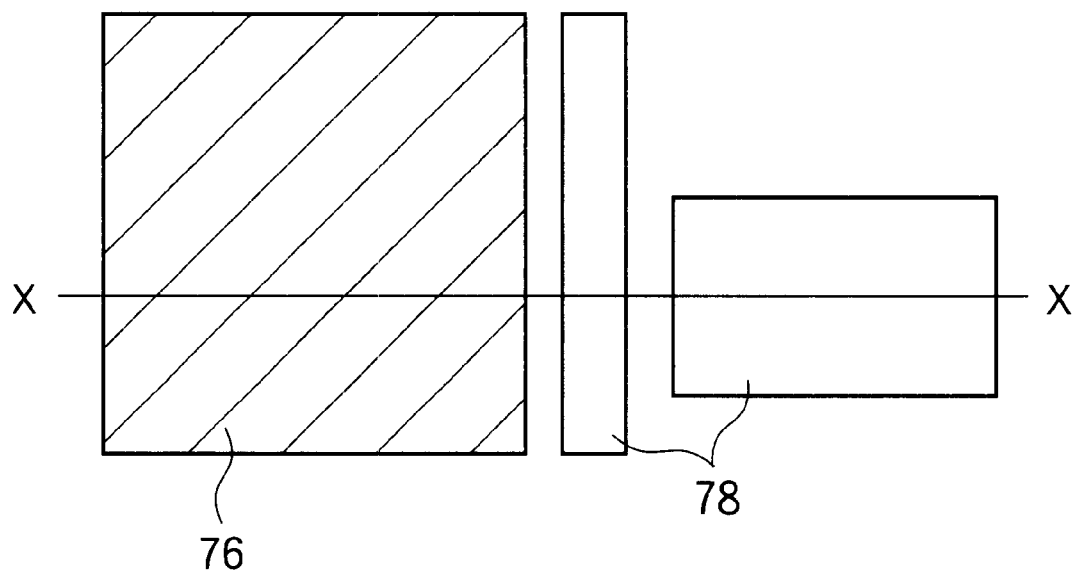
FIGS. 10A and 10B illustrate problems with the prior art.
Figure 10B:
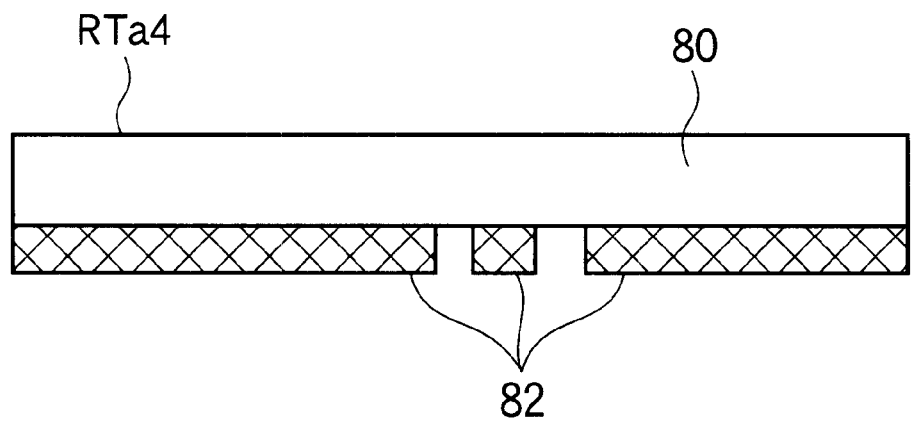
Figure 11A:
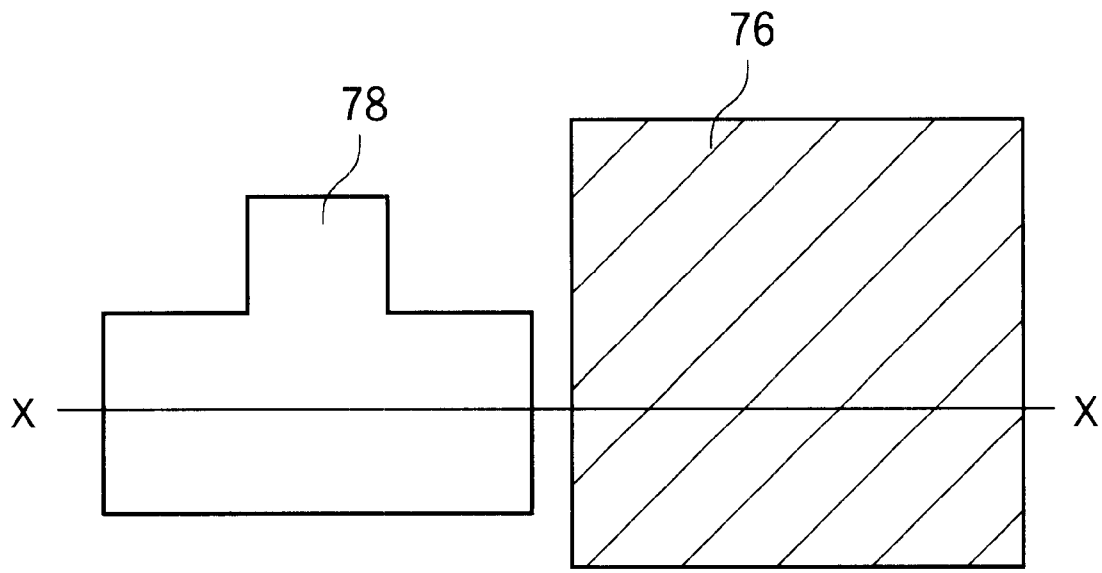
FIGS. 11A and 11B illustrate problems with the prior art.
Figure 11B:
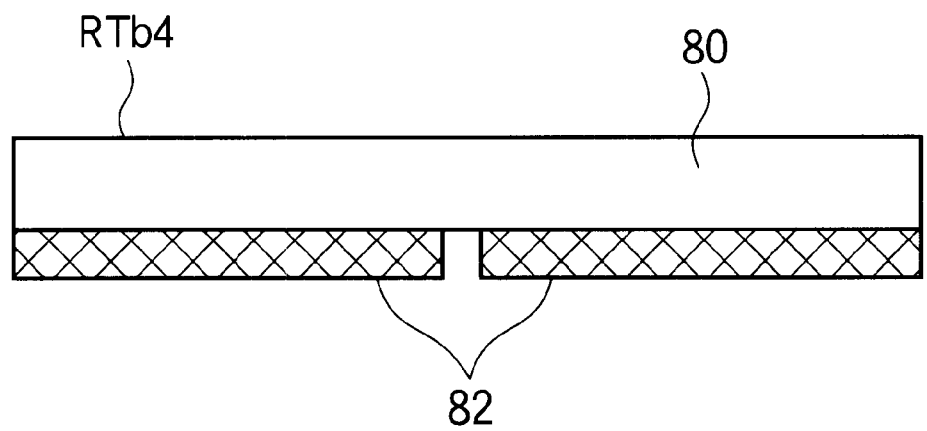

FIG. 5 illustrates a basic pixel unit 40 of a TFT matrix substrate 50 in FIG. 4, and FIG. 6 is a sectional view taken along the line A—A in FIG. 5.

At the pixel 40, a gate bus line 32 and a drain bus line 34 are provided on a substrate 30 perpendicularly to each other with an insulation film interposed, and a TFT 36 is formed in the vicinity of the intersection between them. A drain electrode 36D of the TFT 36 is provided on the gate bus line 32 extending from the drain bus line 34 and serving also as a gate electrode with a gate insulation film, semiconductor film and the like interposed therebetween. Further, a source electrode 36S is provided in a face-to-face relationship with the drain electrode 36D at a space from the same. The source electrode 36S is connected to a pixel electrode 38 through a contact hole 44. A storage capacitor bus line 41 located in the same layer as the gate bus line is provided near the center of the pixel region. A storage capacitor electrode 42 is provided on the storage capacitor bus line 41 with a gate insulation film, active semiconductor film and the like interposed therebetween. A storage capacitor is formed in this region. The storage capacitor electrode 42 is connected to the pixel electrode 38 through a contact hole 46.

Manufacturing steps will now be described with reference also to the sectional view in FIG. 6.

First, a metal layer made of chromium or the like is deposited on the glass substrate 30 and is patterned at a first photolithographic step to form the gate bus line 32 and storage capacitor bus line 41.

Next, a gate insulation film 52 constituted by a silicon nitride film, an amorphous silicon layer and a silicon nitride film are consecutively deposited, and a second photolithographic step is performed to form a channel stopper 56 with the upper silicon nitride film left on the gate bus line 32.

Next, an n$^+$-type amorphous silicon layer and a metal film made of chromium or the like are deposited, and a third photolithographic step is performed to pattern the metal film, the n$^+$-type amorphous silicon layer and the amorphous silicon layer to form a drain electrode comprised of an active semiconductor layer 54T, an n$^+$-type amorphous silicon layer 58D and a metal layer 60D, a source electrode 36S comprised of an n$^+$-type amorphous silicon layer 58S and a metal layer 60S, and a counter electrode 42 comprised of an n$^+$-type amorphous silicon layer 58C and a metal layer 60C. A drain bus line which is not shown in FIG. 6 is also formed simultaneously.

The reticles RTa2 and RTb2 in FIGS. 2 and 3 are used at the third photolithographic step. Specifically, a resist is applied to the entire surface after the metal film is deposited at the above-described step. Thereafter, the reticle RTa2 is first used to expose the first region 100 and the third region 300 of the TFT matrix. Next, the reticle RTb2 is used to expose the second region 200 and third region 300. The resist is then developed to performing patterning through etching.

Then, a protective film 62 constituted by a silicon nitride film is formed, and a fourth photolithographic step is performed to form contact holes 44 and 46.

Next, a transparent conductive film made of ITO is deposited, and a fifth photolithographic step is performed to pattern the ITO into the configuration of the pixel electrode 38.

Then, an alignment film 64 is formed on the entire surface to complete the TFT matrix substrate. Further, a common electrode made of ITO is provided; an opposite substrate formed with color filters (CF substrate) is combined if necessary; and liquid crystal is injected to completer a liquid crystal panel.

As described in detail above, the present invention provides an effect that is similar to moving a desired pattern vulnerable to influence of diffracted light from an edge of a shading pattern to a location where it becomes less vulnerable to such influence in a boundary portion where patterns are joined with a plurality of exposure masks. As a result, an advantage is provided in that any reduction of the thickness of a pattern attributable to diffracted light can be avoided to allow preferable patterning.

What is claimed is:

1. A patterning method for forming a group of patterns in which first patterns serving as basic units are repetitively arranged using a plurality of exposure masks, the method comprising the step of:

exposing a third region sandwiched between a first region exposed with a first exposure mask and a second region exposed with a second exposure mask in a complementary manner with the first and second exposure masks, repetitive unit patterns for exposing the third region being different from the first patterns;

wherein the unit pattern is a pattern which is a division of the first pattern.

2. A patterning method for forming a group of patterns in which first patterns serving as basic units are repetitively arranged using a plurality of exposure masks, the method comprising the step of:

exposing a third region sandwiched between a first region exposed with a first exposure mask and a second region exposed with a second exposure mask in a complementary manner with the first and second exposure masks, repetitive unit patterns for exposing the third region being different from the first patterns;

wherein the unit pattern is a pattern which is a combination of a part of one of the first patterns as a result of division and a part of another first pattern adjacent thereto as a result of division.

3. A method of manufacturing a thin film transistor matrix substrate comprising the step of:

forming at least either of gate bus lines and drain bus lines using the patterning method according to claim 1 or 2.

4. A plurality of exposure masks for connecting patterns by overlapping them at a boundary portion to form a group of patterns, the masks comprising:

first patterns to serve as basic units arranged in a repetitive manner;

patterning regions at the boundary portion formed in a complementary manner; and exposure patterns for the patterning regions being different from the first patterns;

wherein the exposure pattern is a pattern which is a division of the first pattern.

5. A plurality of exposure masks for connecting patterns by overlapping them at a boundary portion to form a group of patterns, the masks comprising:

first patterns to serve as basic units arranged in a repetitive manner;

patterning regions at the boundary portion formed in a complementary manner; and exposure patterns for the patterning regions being different from the first patterns;

wherein the exposure pattern is a pattern which is a combination of a part of one of the first patterns as a result of division and a part of another first pattern adjacent thereto as a result of division.

* * * * *